United States Patent [19]

Mörsen et al.

[11] Patent Number: 5,503,677

[45] Date of Patent: Apr. 2, 1996

[54] PROCESS AND DEVICE FOR COATING THE INNER SURFACE OF GREATLY ARCHED, ESSENTIALLY DOME-SHAPED SUBSTRATES BY CVD

[75] Inventors: Ewald Mörsen, Morfelden; Helge Vogt, Nackenheim; Johannes Segner, Stromberg, all of Germany

[73] Assignee: Schott Glaswerke, Mainz, Germany

[21] Appl. No.: 340,910

[22] Filed: Nov. 15, 1994

Related U.S. Application Data

[62] Division of Ser. No. 141,656, Oct. 26, 1993.

[30] Foreign Application Priority Data

Oct. 26, 1992 [DE] Germany ........................... 42 36 056.0
Oct. 11, 1993 [DE] Germany ........................... 43 34 572.7

[51] Int. Cl.$^6$ .................................................. C23C 16/00
[52] U.S. Cl. ............................ 118/723 R; 118/723 MW; 118/723 ME; 118/728
[58] Field of Search ....................... 118/723 R, 723 ME, 118/723 MW, 728; 204/298.07, 298.38, 298.15; 156/345

[56] References Cited

U.S. PATENT DOCUMENTS

| | | | |
|---|---|---|---|
| 3,524,590 | 8/1970 | Myskowski | 239/424.5 |
| 3,888,649 | 6/1975 | Simhan | 65/60 |
| 3,951,100 | 4/1976 | Sopko et al. | 118/48 |
| 4,466,876 | 8/1984 | Sakai | 204/298 |
| 4,995,341 | 2/1991 | Matsuyama | 118/723 MW |
| 5,000,113 | 3/1991 | Wang | 118/723 E |
| 5,007,372 | 4/1991 | Hattori | 118/715 |
| 5,154,943 | 10/1992 | Etzkorn et al. | 427/569 |
| 5,236,511 | 8/1993 | Etzkorn et al. | 118/723 |
| 5,324,361 | 6/1994 | Etzkorn et al. | 118/719 |

FOREIGN PATENT DOCUMENTS 2071582  12/1992  Canada.
4008405  7/1991   Germany.
4120176  2/1992   Germany.

OTHER PUBLICATIONS

CRC Handbook of Chemistry and Physics, 62nd edition, p. F–51, R. C. Weast, Ed., CRC Press, Inc., Boca Raton, Florida (1981–1982).

*Primary Examiner*—R. Bruce Breneman
*Assistant Examiner*—Joni Y. Chang
*Attorney, Agent, or Firm*—Millen, White, Zelano, & Branigan

[57] ABSTRACT

A process and a device for coating the inner surface of a greatly arched, essentially dome-shaped substrate by CVD are described. In the process, the reaction gases, which contain the layer-former molecules, are conveyed into the reaction chamber containing the substrate(s) to be coated, through at least one gas inlet, placed facing the vertex of the dome at a distance from the surface to be coated. Deposition of the layer material on the substrate is brought about in a way known in the art by producing a reaction zone on the inner surface of the substrate to be coated. According to the invention, the reaction gases do not, as is usual for known processes, flow slowly into the reaction chamber. Instead, for production of a uniform coating, the reaction gases are introduced into the reaction chamber at a high speed such that the product of Reynolds number, R, of the gas jet in or in the immediate vicinity of the gas inlet and the distance, h, between the gas inlet and the dome vertex is:

$$400 < R \times h[\text{mm}] < 4000.$$

The process according to the invention has the advantage that otherwise usual measures for the production of a laminar gas stream of the reaction gases as well as measures for spatial delimitation of the reaction zone to avoid glass soot formation can be dispensed with without degrading the layer quality. The gas jet can be produced by simple nozzle elements also that can be universally used for different substrate geometries.

10 Claims, 3 Drawing Sheets

PROCESS AND DEVICE FOR COATING THE INNER SURFACE OF GREATLY ARCHED, ESSENTIALLY DOME-SHAPED SUBSTRATES BY CVD

This application is a divisional of application Ser. No. 08/141,656, filed Oct. 26, 1993.

The invention relates to a process for coating the inner surface of greatly arched, essentially dome-shaped substrates or substrates approximating a dome shape with at least one dielectric layer and/or at least one metallic layer by a CVD (chemical vapor deposition) process, in which the reaction gases, containing the layer-forming molecules, are conveyed through a gas inlet, positioned facing the vertex of the dome and spaced from the latter, into a reaction chamber which contains the substrate(s) to be coated. Deposition of layer material onto the substrate is brought about in a way known in the art by producing a reaction zone at the inner surface of the substrate to be coated. The invention further relates to a device for performing the process.

BACKGROUND OF THE INVENTION

A process of the initially mentioned type is suitable especially for the production of reflectors. Such a process is described, for example, in DE 40 08 405 C1, U.S. Pat. No. 5,154,943 and U.S. Pat. No. 5,236,511, the disclosures of which are hereby incorporated by reference.

Reflectors are generally composed of arched, approximately dome-shaped substrates ("domes"), in most cases made of glass, with an inside reflective coating, for example, a cold-light mirror coating (e.g., as employed for dental mirrors). In particular, glass blanks shaped by pressing are usually used as substrates. The outer surface of the shaped glass blanks are provided with lamp shafts, so-called dome necks, for the electrical connections. The reflective coating can comprise a metallic layer or, if a special spectral gradient of reflectance is desired, the reflective coating can comprise a dielectric layer. The optical quality requirements of such layers, especially also of the uniformity of the coating, are high.

From DE 40 08 405 C1 and its corresponding U.S. Pat. Nos. 5,154,943 and 5,236,511, it is known to produce such reflectors by a plasma-CVD process (PCVD). Plasma-CVD processes and also the production of dielectric layer systems with a given spectral gradient, are known in the art and described diversely in the patent literature and other literature. However, until the invention of DE 40 08 405 C1, it was not possible to use plasma-CVD processes for production of layer systems of high optical quality on greatly arched substrates, such as, e.g., production of reflective coatings on domes to be used in the production of reflectors. For the production of a uniform coating on a greatly arched substrate, it is necessary, if an expensive relative motion between substrate and coating zone is to be avoided, that the layer-forming reaction zone extend over the entire surface to be coated during the coating process. For this purpose, high-volume plasma zones are necessary, since for complete covering of the entire surface to be coated, the region enclosed by the greatly arched substrates also has to lie inside the plasma area.

However, as the thickness of the plasma zone over a surface to be coated increases, the probability also increases that, by a so-called homogeneous reaction, particles will form in the gas-filled space which will then deposit as "glass soot." This particle formation leads to layer cloudiness, making the layers unusable for optical applications. Particle formation occurs especially in the edge areas of the plasma zone, inside which the power density of the plasma drops below a critical value.

To suppress the above-described particle formation in the gas-filled space during plasma-CVD coating of greatly arched substrates, it is proposed in DE 40 08 405 C1, to limit the thickness of the gas layer to be reacted over the surface to be coated by the use of a so-called displacement element. The displacement element penetrates into the inner space enclosed by the dome, for example, when the dome is to be coated on the inside, and exhibits a shape corresponding substantially to the shape of an arched substrate. As a result, the extent of the glass soot formation occurring in the gas layer during the plasma phase remains harmless for the desired optical layer quality. The displacement element of DE 40 08 405 C1 thus has the object, among other things, of masking the low power density edge areas of the plasma zone inside which glass soot formation especially occurs. Due to the displacement element, the layer-former molecules are trapped and held in a solid layer on the surface. Without the opposing surface of the displacement element, the layer-forming molecules would penetrate into the edge areas of the plasma zone and contribute to particle production. The supply of reaction gases takes place according to D 40 08 405 C1 through the displacement element which, for this purpose, exhibits a duct that ends in a central gas outlet at the front surface thereof. The gas inlet is thus positioned so as to face the vertex of the dome at a distance from the surface to be coated.

In CVD processes, reactions gases usually are conveyed so that they flow slowly and continuously into the reaction chamber containing the substrate(s) to be coated. An initial consideration was the fact that turbulences in the gas streams resulted in layer unevenness. Turbulences should therefore be avoided at all costs. Thus, the displacement element described in DE 40 08 405 C1 is used to not only delimit the reaction zone, but to also produce a slow and continuous flow of reaction gases along the surface to be coated.

A disadvantage associated with the known process is that it is expensive to perform. The displacement element, which as a rule is positioned at only a small distance from the surface to be coated, is coated along with the substrate to practically the same thickness. Therefore, to prevent a gradual closing of the gap between the surface of the displacement element on the substrate side and the inner surface of the substrate, it is necessary to regularly remove the deposited layer. Especially when using a plasma-pulse-CVD process, gradual reduction of the distance between the displacement element and the substrate, i.e., reduction of the thickness of the gas layer to be reacted, results in an undesirable reduction of the rate of coating during the coating process. Another drawback of the known process is that the displacement element is very expensive to produce, since it has to be matched, in each case, to the shape of the substrate to be coated.

SUMMARY OF THE INVENTION

An object of the invention is to provide a process of the initially mentioned type that does not exhibit the above-described drawbacks. The process yields coatings of high optical quality as well as mechanical, thermal and chemical stability, and nevertheless can be performed simply and economically. Another object of the invention is to provide a device for performing the coating process, the device being distinguished by the simplest possible design and can also be used universally for various substrate geometries without requiring, in each case, a matching of geometries. Further, when parts of the reaction chamber are also coated, a change in critical dimensions of the reaction chamber does not result with the device according to the invention.

Upon further study of the specification and appended claims, further objects and advantages of this invention will become apparent to those skilled in the art.

These objects are achieved by a process for coating arched substrates comprising:

conveying reaction gases containing layer-former molecules through at least one gas inlet into a reaction chamber containing at least one substrate(s) to be coated, the gas inlet being placed facing the arch (e.g., dome) vertex at a distance from the inner surface of the substrate to be coated; and depositing layer material on the at least one substrate by producing a reaction zone at the inner surface of the at least one substrate to be coated, wherein the reaction gases are conveyed into the reaction chamber at a speed such that the product of the Reynolds number, R, of the gas jet in the gas inlet and the distance, h, between the gas inlet and the dome vertex satisfies the following relationship:

$$400 < R \times h[\text{mm}] < 4000.$$

A device for performing the process according to the invention comprises:

a reaction chamber in which an arched substrate to be coated can be placed;

means for supplying and means for removing reaction gases to and from the reaction chamber, respectively, and the means for supplying reaction gases comprising at least one gas inlet positioned to face the vertex of the arched (e.g., domed) substrate at a distance from the substrate surface to be coated;

means for producing a reaction zone at the inner surface of each substrate to be coated;

wherein said means for supplying reaction gases comprises at least one nozzle element (16) which does not project or only slightly projects into the interior of the arch (e.g., dome interior), the at least one nozzle element, in each case, exhibits one or more gas inlets (18), whose diameter or overall diameter for producing a directed gas jet is dimensioned so that the device can operate under the conditions that the product of the Reynolds number, R, of the gas jet in the gas inlet (18) or the resulting gas jet in the immediate vicinity of several gas inlets (18) and the distance, h, between the gas inlet(s) (18) and the dome vertex will satisfy the following relationship:

$$400 < R \times h[\text{mm}] < 4000.$$

The arched substrates to be coated by the process according to the invention preferably have a dome base diameter of about 5–200 mm and a dome height of preferably about 2–150 mm.

Although plastic substrates can, in principle, be coated equally as well by the process according to the invention, most plastics are less suitable for use as reflectors owing to their generally low thermal, load-carrying capacity. In addition, the adhesion of the above described coating systems to glass is better than to plastic, particularly in the case of thermal loading.

In contrast to the known CVD processes, the invention introduces the reaction gases into the reaction chamber in a directed gas jet. The rate of flow is high in this connection, so that no significant jet divergence occurs until the gas jet strikes on the inner surface of the substrate at the vertex of the dome. This can be achieved by selecting the rate of flow whereby the product of the Reynolds number, R, of the gas jet in the gas inlet and the distance, h, between the gas inlet and the dome vertex is:

$$400 < R \times h[\text{mm}] < 4000 \qquad (1)$$

wherein

R=r×v×d/n, r=density of the flowing medium, v=speed of the flowing medium, n=dynamic viscosity of the flowing medium, and d=diameter of the gas inlet, The distance, h, is given in mm, but R×h represents a dimensionless variable. Preferably, the R×h value is 1000–3000.

Equation (1) was empirically determined with the help of flow profiles calculated for various Reynolds numbers as well as by experiments for uniformity of coatings as a function of the Reynolds number for various dome geometries, i.e., various dome sizes. For current uses, domes with a height (=distance between base of the dome and vertex) of about 8–100 mm are of special interest. In such cases, the dome base diameter preferably satisfies the following relationship:

$$0.7 \times \text{dome height} \leq \text{dome base diameter} \leq 3.0 \times \text{dome height}.$$

Surprisingly, it has been determined that by using the process according to the invention uniform coatings, i.e., those with almost uniform layer thickness over the entire substrate surface, can be achieved. In particular, it has also been determined that for domes with a dome neck, the geometry of the cross section surface of the dome neck has no influence on the uniformity of the coating. This is possibly explained by the formation of a gas cushion in the dome neck, which fills the entire space of the dome neck and an azimuthally uniform deflection of the gas jet occurs at its interface with the reaction chamber. The dome neck can also be covered during the coating.

Also, with the process according to the invention, despite the absence of spatial delimitation of the plasma zone by suitable solid surfaces to an area with uniformly high power density, layers of high optical quality as well as mechanical, thermal and chemical stability are obtained. Glass soot formation does not take place. This can possibly be explained, as discussed in more detail below based on calculated flow profiles, by the formation of special flow turbulences in the dome interior when the reaction gases are introduced according to the invention.

A suitable device for performing the process according to the invention exhibits, for introducing the reaction gases, a nozzle element with a gas inlet that is positioned essentially outside the dome interior, i.e., does not project into or only slightly projects into the dome interior. In this way, if the nozzle is also coated, no changes in the critical dimensions of the reaction chamber space result. Preferably, the nozzle element does not extend from the dome base into the dome interior more than 50% of the dome height.

Otherwise, with the exception of the diameter of the gas inlet or the total diameter of several gas inlets (by this, the diameter of the resulting gas jet, as it forms directly after exiting the nozzle element, is to be understood), no special requirements exist for the geometric shape of the nozzle element. It is possible, by shaping the side of the nozzle element facing the coating space, to influence the layer thickness within certain limits. Many different nozzle shapes are thus suitable for producing the directed gas jet. A preferred nozzle element is, however, presented below. This nozzle element has proven especially suitable for, in particular, coating dome-shaped substrates for production of reflectors.

BRIEF DESCRIPTION OF THE DRAWINGS

Various other objects, features and attendant advantages of the present invention will be more fully appreciated as the same becomes better understood when considered in conjunction with the accompanying drawings, in which like reference characters designate the same or similar parts throughout the several views, and wherein.

DETAILED DESCRIPTION

Figure 1:
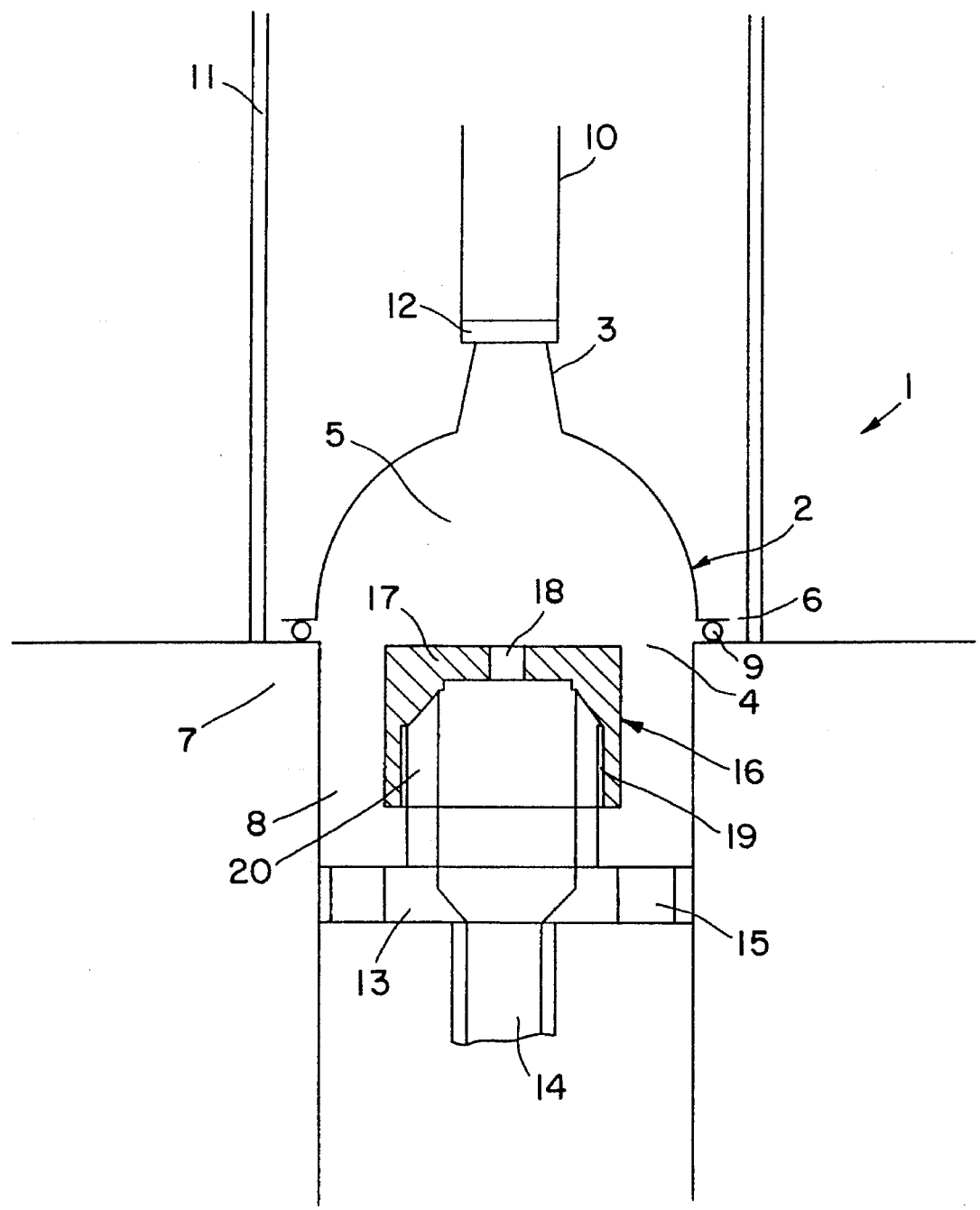
FIG. 1 illustrates a coating station for providing an inner coating of an individual dome for production of a reflector using a flat nozzle to produce a directed gas jet according to the invention.

A coating station 1 of a coating installation for plasma-CVD coating of an individual dome is shown in FIG. 1, in which, as known from DE 40 08 405 C1, the domed substrate itself forms a part of the reaction chamber. Suitably, a plasma-CVD installation exhibits several such coating stations 1. The advantages of a single coating station facing a reaction chamber, in which several domes to be coated are placed and coated together, are described in DE 40 08 405 C1.

In FIG. 1, the dome to be coated 2 is to be used to produce a reflector and exhibits a dome neck 3.

Before coating, substrates 2 are usually subjected to a cleaning process, in which certain cleaning procedures, e.g., those in which a cleaning liquid flows through dome 2, make it necessary to remove the seal on dome neck 3 resulting from shaping after pressing. In these open domes, dome neck 3 is closed airtight by suitable measures before installation of dome 2 in a coating station 1.

Reaction chamber 4 is, as described above, formed by interior space 5 of the dome itself and another part joined to dome 2. This part can be, as known from DE 40 08 405 C1, a glass vessel open on one side that is joined to dome base 6. However, in FIG. 1 an embodiment is represented, in which dome 2 is set on a base plate 7, preferably made of a metallic material having a corresponding recess 8 for gas inlets and gas outlets, which forms the lower part of reaction chamber 4. A sealing ring 9 between dome base 6 and base plate 7 provides for a gastight connection of both parts. This embodiment has the advantage of simpler production and cleaning relative to the joined vessel known from DE 40 08 405 C1. Furthermore, metal plate 7 simultaneously forms a shield against microwave radiation.

Coating station 1 shown in FIG. 1 further contains a microwave-inner conductor/outer conductor arrangement for transferring microwave energy to the reaction zone to ignite and feed the plasma. The advantages of PCVD processes by microwave-stimulated plasmas is known. The inner conductor is designated by a reference numeral 10, the outer conductor by reference numeral 11. Between inner conductor 10 and dome neck 3, a sealing disk 12 is placed which seals the open dome neck.

The bottom of reaction chamber 4 forms, in FIG. 1, without narrowing its generality, a nozzle plate 13. In FIG. 1, nozzle plate 13 has a central gas inlet 14 and gas outlets 15 azimuthally uniformly distributed around the central gas inlet 14.

The directed gas jet is produced in the device of FIG. 1 by flat nozzle 16. Flat nozzle 16 is distinguished in that it does not project or only slightly projects into the dome interior 5. The flat nozzle 16 essentially comprises a plate 17, the surface of which can be flat, convex or concave, and can exhibit a shape for specific influencing of the flow conditions in the dome interior. With convex surface areas of the flat nozzle, the layer thickness on the substrate areas is increased whereas, with concave surface areas, the layer thickness is reduced. The relationship between shaped areas of the flat nozzle and areas of the layer to be influenced on the dome can be determined empirically in each case.

Flat nozzle 16 can be an integral component of nozzle plate 13. Alternatively, it can also, for example, exhibit an assembly bore 19 and be mounted, e.g., slipped on in an easily removable manner, on a cone projection 20 of nozzle plate 13. The component is then easily removable for cleaning. Instead of cone projection 20, nozzle plate 13 can also exhibit a threaded extension, on which flat nozzle 16 can be easily screwed onto and thereby be adjustable in height.

To produce a uniform coating on a substrate (axially symmetrical relative to the dome axis), flat nozzle 16, in FIG. 1, is provided with central opening 18 for discharging the exiting gas jet centrally within reaction chamber 4, i.e., at the dome axis. It is seen in FIG. 1 that the gas jet is directed toward the vertex of the dome, i.e., toward the dome neck.

As mentioned above, the shape of dome neck 3 surprisingly has little or no influence whatsoever on the uniformity of the coating. Thus, entirely uniform coatings are achieved even with dome necks of various rectangular cross sections, as long as the gas jet enters the dome neck completely. But, to avoid providing an inner coating in the dome neck, the latter is preferably covered during the coating process.

Further, to assure a uniform coating, the arrangement of gas inlets 14 or gas outlets 15 should also be matched to the geometry of the substrate to be coated. Thus, in FIG. 1, gas inlet 14 is located in the center point of nozzle plate 13, facing the dome vertex, at a distance from the surface to be coated, while several gas outlets 15 are placed azimuthally uniformly distributed around the gas inlet, so that a uniform suction of the reaction gases is assured. Gas outlets 15 are logically configured individually so that they together form an approximately annular gap surrounding gas inlet 14. Moreover, other suitable geometric arrangements of the gas outlets and the gas inlet can be easily determined without inventive activity by one skilled in the art using routine experimentation.

With correspondingly large diameter (e.g., when coating large domes), gas inlet (18) of nozzle element (16) can also be several individual openings. For example, gas inlet (18)

can be designed as a gas shower with a plurality of smaller openings adjoining one another. In such a case, the diameter of the entire gas inlet area of the gas shower, rather than the diameter of the individual smaller openings, is used to calculate the Reynolds number. To simplify matters, the diameter of the resulting gas jet exiting the nozzle in direct proximity to the gas inlets is used.

The use of the above-described flat nozzle has the advantage that it has to be cleaned only very infrequently. It is true that its surface is also coated, like the displacement element from DE 40 08 405 C1, but the resulting layer has no influence, even at relatively very large thickness, on the function of the coating process and the quality of the dome coating, since it does not change any critical dimensions of the reaction chamber. The flat nozzle lies either completely outside dome interior (5) or occupies Only a very small part of it. In particular, it turns out that the bore itself and its immediate vicinity are advantageously, in practice, not coated. The layer deposited on the flat nozzle after numerous coating processes has to be removed only after considerably longer exposure times than those known from the prior art. Namely, the deposition layer is removed if a detachment of flakes of the coating is to be feared. In general, therefore, the exposure times of a nozzle element compared to the displacement elements known from the prior art are greater by a factor of 10 to 100.

Figure 2:
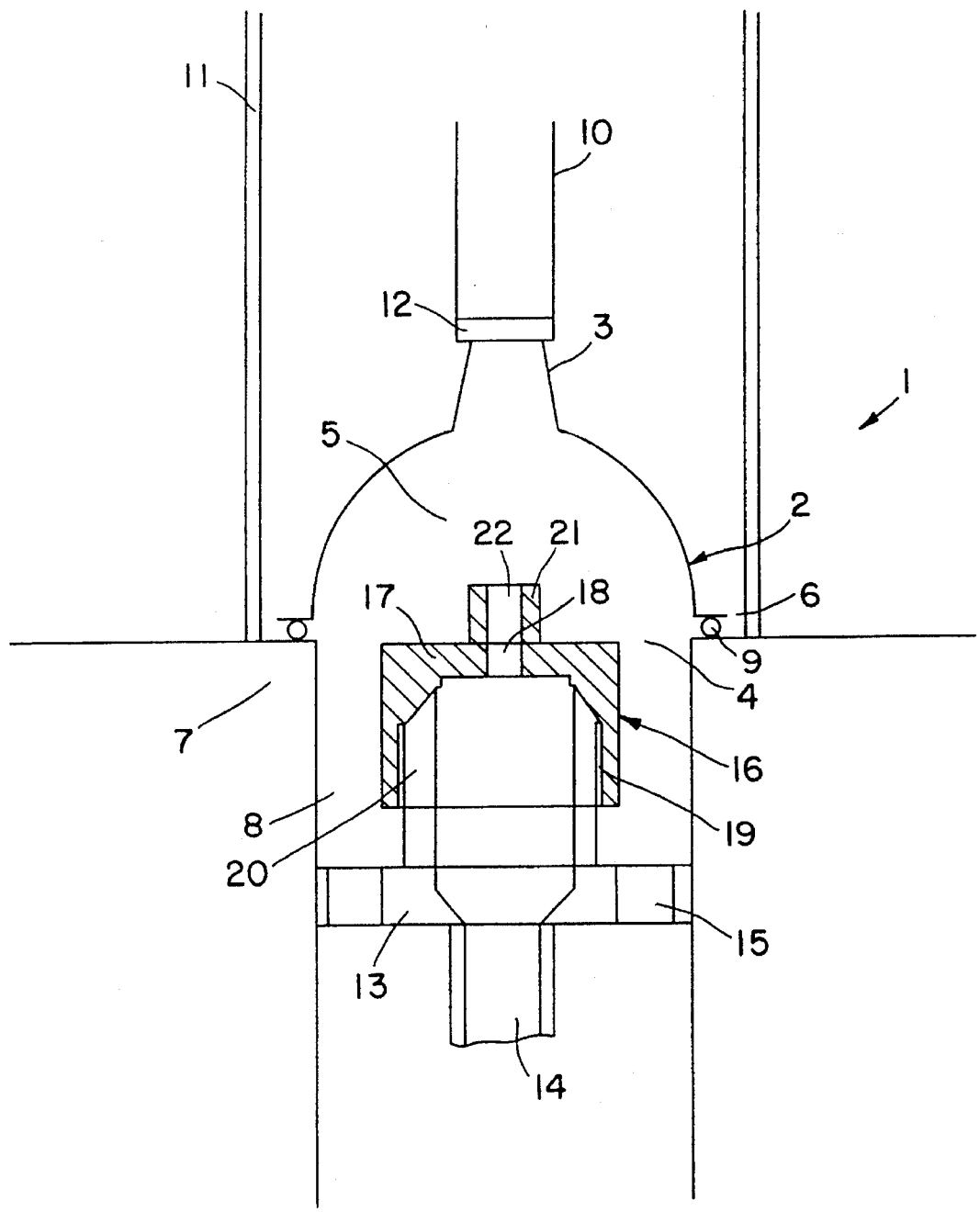
FIG. 2 illustrates a coating station similar to FIG. 1 in which a flat nozzle provided with a tubular projection is employed for better direction of the gas jet to the gas outlet.

In FIG. 2, for better guiding, flat nozzle 16 carries a tubular projection 21, whose inner bore 22 is connected with gas outlet 18. Tubular projection 21 effectively prevents a premature expansion of the gas jet. Also, tubular projection 21 occupies only a small part of dome interior 5, so that in this embodiment of the device, coating of the nozzle also does not result in any change of critical dimensions in the reaction space. The use of tubular projection 21 on flat nozzle 16 has the advantage that the eddies formed in the direction of the dome neck are displaced, so that the expanse of the coating area can be adjusted by means of the length of the tubular projection 21. The eddies are displaced toward the dome vertex as the length of the tubular projection increases.

The nozzle element represented in FIGS. 1 and 2, which is especially suitable for performing the process according to the invention, is shown without narrowing the general application in each case to use in individual coating stations for domes. The process according to the invention can also be performed, especially with the above-described preferred nozzle element, in standard reaction chambers in which several domes are coated together, i.e., simultaneously.

Suitable dimensions for a nozzle element can be easily determined without inventive activity, for example, by routine experimentation. To produce the directed gas jet necessary for the successful performance of the process according to the invention, the diameter of the gas inlet of the gas supply, for example, the above-described flat nozzle, is adjusted as a function of the coating parameters (e.g., mass flow, pressure) responsible for the formation of a gas jet, so that the initially described relation between Reynolds number R and distance h from gas inlet to dome vertex can be met. Also, in the case of the given diameter of the gas inlet, the coating parameters can be matched within certain limits.

Figure 3:
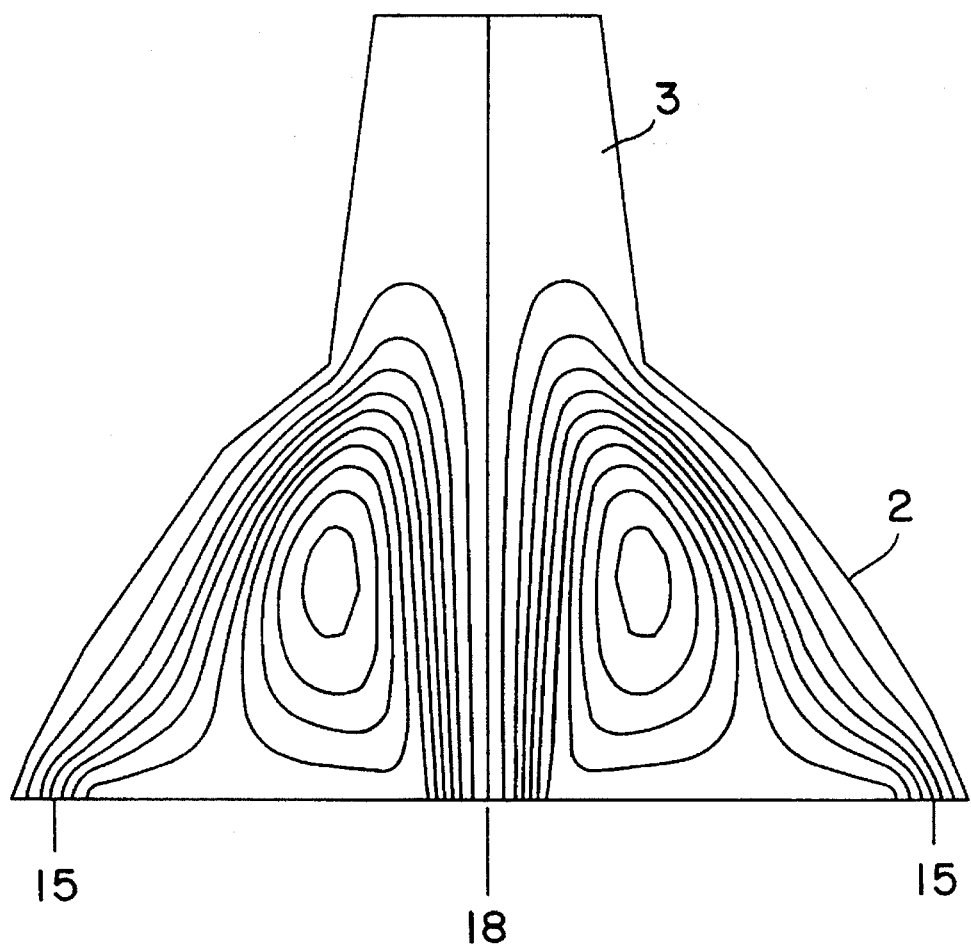
FIG. 3 shows a calculated flow profile of the flow conditions of reaction gases in the inner space of the dome when the process according to the invention is performed.

To represent the flow conditions in the dome when performing the process according to the invention, FIG. 3 shows a flow profile calculated with the help of a commercial simulation program for calculating flows in incompressible media. The calculation was performed for a small dome (diameter 50 mm), in which a value of 6 mm was used for the diameter of nozzle bore 18, a value of 43 mm for the outside diameter of suction duct 15, a value of 35 mm for the inside diameter (approximating the outlet 15 as an annular ring). Also, the calculation was based on a gas mass flow (predominantly $O_2$) of 174 sccm ($cm^3$/min or ml/min). The gas jet, entering through gas inlet 18 directed toward the dome vertex, is shown in the figure. The gas jet is deflected on the vertex of the dome, resulting in the formation of the represented turbulences or eddies. A uniform, homogeneous and dense coating in the dome is achieved when the flow conditions represented in FIG. 3 are present in the dome. This can possibly be explained by the gas turbulences or eddies, which presumably are made up predominantly of used reaction gas, taking over the function of a displacement element, i.e., they limit the thickness of the gas layer to be reacted over the surface to be coated and provide for a laminar flow of fresh reaction gases along the surface to be coated. Since the gas turbulences are probably predominantly depleted of layer-forming material, they themselves presumably do not contribute or only slightly contribute to formation of the coating. Furthermore, fresh reaction gases, as can be easily seen, are conveyed along the back of the gas turbulences in a laminar flow along the surface to be coated. The thickness of this gas layer depends on the level of the turbulences.

Simulation calculations and experiments have now shown that the formation of such gas turbulences can be characterized by the Reynolds number of the gas flow in the gas inlet and the distance from the gas inlet to the dome vertex. Equation (1) presented above results from these calculations and experiments. As long as the product of Reynolds number R and distance h is within the limits indicated in equation (1), the formation of the above-described gas turbulences result, from which a homogeneous, dense and uniform coating is achieved.

The flow conditions in the dome can be characterized as a function of the above-mentioned parameters as follows: at a given distance h, with increasing Reynolds number R (for example, by increasing the mass flow of the reaction gases at constant diameter of the gas inlet(s) or by reducing the diameter at constant mass flow), the formation of gas turbulences at the dome base results. As the Reynolds number is further increased, the gas turbulences travel upward with the dome space. If the Reynolds number increases to still higher values, the flow along the surface to be coated is no longer laminar. Similar calculations can also be made for the conditions at variable distance h with constant Reynolds number R.

For the process described in DE 40 08 405 C1, in which the reaction gases flow slowly into the reaction chamber space over the displacement element, values for the product of the Reynolds number R and the distance h under usual coating conditions can be estimated for purposes of comparison. These are only about 1/10 of the lower limit indicated in equation (1).

Preferably, a plasma-pulse-CVD process is used in the process according to the invention. Plasma-pulse-CVD processes for the production of dielectric and/or metallic layer systems of high optical quality as well as chemical, thermal and mechanical resistance are known in the art and are described, for example, for dome coating, in DE 40 08 405 C1. In particular, the advantages of microwave-plasma-pulse-CVD processes are also sufficiently known and explained in detail, for example, in the above-cited patent specification. It has been shown that the known advantages of a (microwave) plasma-pulse-CVD process are retained when performing the process according to the invention.

The process according to the invention is suitable not only when using a plasma-CVD process, but is also suitable when a thermal CVD process is used. In a thermal CVD process, the reaction zone is produced on the surface to be coated by heating the substrate to correspondingly high temperatures. An advantage of the process according to the invention lies here especially in the rapid exchange of fresh reaction gas for used reaction gas, by which considerably higher coating rates result.

The nozzle element according to the invention, and the remaining parts of the reaction chamber of the individual coating installation (with the exception of the dome itself), should preferably be composed of a material that is sufficiently temperature-resistant and capable of being subjected to vacuum. Thus, the material should be resistant to the attack of chemically aggressive process gases. In addition, if possible, the material is not or is only slightly microwave-absorbent. Materials that combine these properties are in particular metals, for example, aluminum.

The process according to the invention is suitable, especially, for coating arched substrates having a rotationally symmetrical shape such as, e.g., domes or ellipsoidal or parabolically-shaped bodies. However, the process according to the invention is not limited only to use with arched substrates strictly in the mathematical sense. Aspherical substrates, not strictly axially symmetrical, can also be coated.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius and unless otherwise indicated, all parts and percentages are by weight.

The entire disclosure of all applications, patents and publications, cited above and below, and of corresponding German applications P 42 36 056.0, filed Oct. 26, 1992, and P 43 34 572.7, filed Oct. 11, 1993, are hereby incorporated by reference.

EXAMPLE

The following example illustrates the use of a flat nozzle in the production of a cold-light mirror coating on the inside of a dome-shaped glass substrate having a dome neck. As a coating process, a plasma-pulse-CVD process is used.

A dome-shaped substrate made of glass having an outside diameter at the dome base of 50 mm and a height up to the neck of 20 mm is coated. The coating is performed in a dome-coating station as represented in FIG. 1. A flat nozzle with the following dimensions is used: diameter 30 mm, wall thickness 3 mm, diameter of the central bore 4 mm. The surface of the nozzle is located, as represented in FIG. 1, approximately at the height of the dome base. The flat nozzle is slipped onto a cone-shaped projection of the nozzle plate. The distance, h, from the gas inlet to the dome vertex is 20 mm. An approximately circular ring-shaped gas outlet is positioned concentrically to the flat nozzle in the nozzle plate, by which used reaction gases are suctioned off. $TiO_2$ is selected for the high-refractive layers and $SiO_2$ is selected as the layer material for the low-refractive layers. Therefore, hexamethyldisiloxane (HMDSO; $C_6H_{18}OSi_2$), doped $O_2$ mass flow is used for production of $SiO_2$ layers and is alternated with a $TiCl_4$ doped $O_2$ mass flow, used for production of $TiO_2$ layers. During the coating process, the pressure in the reaction chamber is about 0.7 mbar, the temperature of the dome is about 90° C. The $O_2$ mass flow is about 200 sccm, the HMDSO mass flow is about 3.6 sccm and the $TiCl_4$ mass flow is about 3.0 sccm. The other process parameters are: microwave frequency 2.45 GHz, average microwave output 75 W, pulse duration 0.6 ms, pulse pause 20 ms.

To verify equation (1), Reynolds number R is calculated below for the embodiment. For this purpose, the initially indicated equation for R is converted as follows:

Average speed v in the hole cross section is:

$v=(4 \times Q_o \times P_o/P)/(\pi \times d^2)$, density r at a pressure p:

$r=r_o \times P/P_o$, in which $Q_o$, $P_o$ and $r_o$ are the mass flow, the pressure and the density under normal conditions. By using v and r in the above equation, there is obtained for R:

$R=4 \times r_o \times Q_o/(\pi \times d \times n) \sim 1.52 \times Q_o[\text{sccm}]/d[\text{mm}]$ The above simplification applies to oxygen ($r_o$=1.429 kg/m$^3$; n=1.92 $10^{-7}$ Pascal-sec), which is the basic component of the coating gas and thus decisively determines its properties.

If the above-indicated values for mass flow and nozzle diameter are now used in the simplified equation for R, there is obtained:

$$R=76 \text{ or with the above distance h: } R \times h=1520.$$

Equation (1) is thus met for the embodiment.

Altogether, 23 layers are deposited on the inner surface of the dome, alternately consisting of $SiO_2$ and $TiO_2$. The coating is uniform, compact and of high optical quality. The thus produced dome with cold-light mirror coating is especially suitable for use as a reflector in object- and room-lighting technology.

In another embodiment, another dome is coated at the same coating parameters and dimensions of substrate and coating station as in the above embodiment, and a flat nozzle with a tubular projection is used. The dimensions of the tubular projection are: length 5 mm, outside diameter 6 mm, inside diameter 4 mm.

As in the above embodiment, a uniform, compact coating of high optical quality was achieved.

The process according to the invention has the advantage that the service lives of the coating installations are significantly higher than in the case of usual installations. Simple components can be used in the coating installations, such as, e.g., the above-described nozzle elements, which, because of their simple geometric shape, can be produced inexpensively and are also easy to clean. Since the nozzle elements according to the invention, when sensibly dimensioned, do not affect any critical dimensions of the reaction chambers even when they are coated, they are also usable in various substrate geometries universally without matching in each case. Also, the necessity for expensive cleaning procedures is eliminated.

The preceding example can be repeated with similar success by substituting the generically or specifically described reactants and/or operating conditions of this invention for those used in the preceding example.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A device comprising:

a reaction chamber in which an arched substrate to be coated can be placed; and means for supplying reaction gases to said reaction chamber and means for removing reaction gases from said reaction chamber, said means for supplying reaction gases comprising at least one gas inlet positioned to face the vertex of said arched substrate at a distance from said substrate surface to be coated;

wherein said means for supplying reaction gases comprises at least one nozzle element that does not project or only slightly projects into the arch interior, said at least one nozzle element, exhibiting one or more gas inlets, whose diameter or overall diameter for producing a directed gas jet is dimensioned so that the device can operate under the conditions that the product of the Reynolds number, R, of the gas jet in the gas inlet or of the resulting gas jet in the immediate vicinity of several gas inlets and the distance, h, between the gas inlet and said vertex satisfies the following relationship:

$$400 < R \times h [mm] < 4000.$$

2. A device according to claim 1, wherein the nozzle element is a flat nozzle which, on the side facing the substrate, has a plate with a central inlet for discharging a directed gas jet at sufficient speed.

3. A device according to claim 2, wherein said nozzle plate is concave or convex.

4. A device according to claim 1, wherein said gas inlet is designed as a gas shower.

5. A device according to claim 1, wherein said flat nozzle exhibits a tubular projection projecting into the arch interior for alignment of the gas jet.

6. A device according to claim 1, wherein said flat nozzle is mounted on a conical projection of said nozzle plate.

7. A device according to claim 1, wherein said device further comprises means for producing a reaction zone over the inner surface of said substrate to be coated, the reaction zone-producing means being a microwave-inner conductor and outer conductor arrangement positioned outside of said reaction chamber.

8. A device according to claim 1, wherein an said substrate is dome-shaped and forms a part of said reaction chamber.

9. A device according to claim 8, wherein the dome-shaped, arched substrate has a dome base diameter of 5–200 mm and a dome height of 2–150 mm.

10. A device according to claim 8, wherein the dome-shaped substrate has a dome height of 8–100 mm and the dome base diameter satisfies the equation:

$$0.7 \times \text{dome height} \leq \text{dome base diameter} \leq 3.0 \times \text{dome height}.$$

* * * * *